United States Patent [19]

Takahashi

[11] Patent Number: 4,908,682
[45] Date of Patent: Mar. 13, 1990

[54] POWER MOSFET HAVING A CURRENT SENSING ELEMENT OF HIGH ACCURACY

[75] Inventor: Mitsuasa Takahashi, Tokyo, Japan

[73] Assignee: NEC Corporation, Tokyo, Japan

[21] Appl. No.: 339,486

[22] Filed: Apr. 17, 1989

[30] Foreign Application Priority Data

Apr. 19, 1988 [JP] Japan ................................. 63-97202

[51] Int. Cl.⁴ ........................................... H01L 29/78
[52] U.S. Cl. .................................. 357/23.4; 357/23.14; 357/41; 357/46
[58] Field of Search ..................... 357/23.4, 23.14, 41, 357/46

[56] References Cited

U.S. PATENT DOCUMENTS 4,680,604 7/1987 Nakagawa et al. ................ 357/23.4

Primary Examiner—Edward J. Wojciechowicz
Attorney, Agent, or Firm—Helfgott & Karas

[57] ABSTRACT

Herein disclosed is a vertical power MOSFET having a current sensing MOSFET, in which the base region of the current sensing MOSFET is electrically connected with the base region of the vertical MOSFET whereas the current leading-out electrode of the current sensing MOSFET is connected with only the source region of the current sensing MOSFET.

6 Claims, 4 Drawing Sheets

POWER MOSFET HAVING A CURRENT SENSING ELEMENT OF HIGH ACCURACY

BACKGROUND OF THE INVENTION

1. Field of the Invention

The present invention relates to a power MOSFET and, more particularly, to a power MOSFET having a current sensing element of high accuracy.

2. Description of the Related Art

In the vertical type field effect transistor having a current sensing element according to the prior art, a small part (e.g., about 1/3,000) of active cells is separated from the source electrode of the field effect transistor to sense the current flowing through the field effect transistor as disclosed in U.S. P. No. 4,553,084.

FIG. 1 is a sectional view for explaining a vertical type field effect transistor according to the prior art. The field effect transistor has a common $N^-$-type drain 2 and an $N^+$-type drain 1 formed thereunder. A plurality of bases 3 and a base 3' are formed with P-type in the $N^-$ drain 2. An active cell 20 and a current sensing cell 30 are formed by using the bases 3 and the base 3', respectively. $N^+$-type sources 4 and 4' are respectively formed in the bases 3 and 3'. Gate electrodes 5 are formed to overlay a portion between the adjacent sources 4, 4'. Source electrodes 7 for the active cell 20 are formed to contact the bases 3 and the sources 4, while source electrode 8 for the current sensing cell 30 is formed to contact the base 3' and the source 4'.

When sensing the current flowing through the active cell 20, the potential at the source electrode (or current sensing electrode) 8 of the current sensing cell 30 is different from that of the source electrode 7 of the active cell 20, since the source electrode 8 is connected to a load resistor (205 in FIG. 2) while the source electrode 7 is grounded. Furthermore, since the base region 3' forming the channel of the current sensing cell 30 is connected with the source electrode 8 of the current sensing cell 30, the gate-source bias of the current sensing cell 30 changes with the current flowing through the current sensing cell 30 the value of which is proportional to the current of the active cell 20. As a result, the sensed current is influenced by the current of the active cell 20 to be sensed. Thus, the sensing accuracy is not reliable.

FIG. 2 is a circuit diagram showing the case in which the current is sensed by the device in the prior art. In FIG. 2, reference numeral 200 designates a MOSFET, numeral 201, a current sensing MOSFET, numeral 202, a load resistor, numeral 203, a mirror terminal, numeral 204, a Kelvin terminal, numeral 205, a current sensing resistor, numeral 206, a comparator, numeral 207, a reference voltage, numeral 208, an output terminal, numeral 209, a gate drive circuit, numeral 210, a drain terminal, numeral 211, power source, numeral 212, a source terminal, numeral 213, the ground, and numerals 214 and 215, back gates (or bases).

The back gate 214 of the current sensing MOSFET 201 is electrically connected with the mirror terminal 203, while the back gate 215 of the MOSFET 200 is connected with the source terminal 212 and is connected to the mirror terminal 203 through the current sensing resistor 205. Therefore, the channel forming voltage of the current sensing MOSFET 201, i.e., the voltage difference between the gate and the back gate, becomes lower than that of the MOSFET 200 by the voltage drop across the current sensing resistance 205, so that the current sensing accuracy is lowered. The lower the gate voltage is, the more serious the drop in accuracy is.

Referring back to FIG. 1, when the potential of the current sensing electrode 8 is not fixed (e.g., when the current sensing terminal is not used), the potential of the base region 3' of the current sensing cell 30 floats, so that the extension of the depletion layer at the current sensing cell 30 is suppressed in comparison with the active cell 20. As a result, the breakdown voltage of the current sensing cell 30 is decreased.

SUMMARY OF THE INVENTION

It is, therefore, an object of the present invention to provide a power MOSFET having a current sensing element of high accuracy.

It is another object of the present invention to provide a power MOSFET having a current sensing element free from any drop of the breakdown voltage.

The MOS field effect transistor according to the present invention includes a drain region of one conductivity type, a plurality of first base regions of the opposite conductivity type formed in one principal surface of the drain region, a plurality of first source regions of the one conductivity type formed in the first base regions, a first gate electrode formed over first portions of the first base regions between the first source regions and the drain region, a source electrode connected commonly with the plurality of first base regions and the plurality of first source regions, a second base region of the opposite conductivity type formed in the one principal surface of the drain region, a second source region formed in the second base region, a second gate electrode formed over second portion of the second base region, the second portion being sandwiched between the second source region and the drain region and the second gate electrode being electrically connected with the first gate electrode, a base electrode electrically connected with the second base region and the source electrode, the base electrode being not connected with the second source region, a current leading-out electrode electrically connected with the second source region, the current leading-out electrode being not connected with the second base region, and a drain electrode electrically connected with the drain region.

The active cell is composed of the first base regions, the first source regions, the drain region, the source electrode, the first gate electrode and the drain electrode. The current sensing cell is composed of the second base region, the second source region, the drain region, the base electrode, the current leading-out electrode and the drain electrode.

According to the present invention, since the base region forming the channel of the current sensing cell and the base regions forming the channel of the active cell are electrically connected and the current sensing electrode is connected only with the source region of the current sensing cell, the gate-base voltage of the current sensing cell and the gate-base voltage of the active cell can be equalized. Consequently, the current led out from the current sensing electrode is hardly influenced by the potential of the current sensing electrode, so that the current sensing accuracy can be improved.

Moreover, since the base region of the current sensing cell is electrically connected with the base regions of the active cell, the potential at the base region is fixed, even when the current sensing electrode is not used, so that the breakdown voltage is not dropped.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 3:
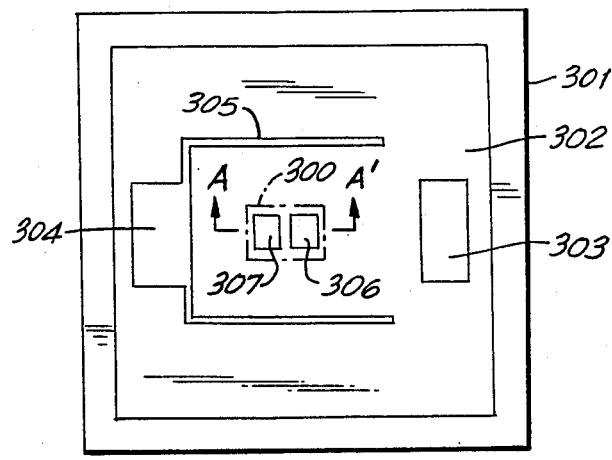
FIG. 3 is a plan view for describing a first embodiment in which the present invention is applied to an N-channel vertical type field effect transistor.

Referring to FIG. 3, a current sensing cell 300, a mirror terminal 306 and a Kelvin terminal 307 are formed at the center of a semiconductor chip 301 so as to enhance the current sensing accuracy. A source pad 303 and a gate pad 304 is formed in the element region 302. Gate fingers 305 extend from a gate pad 304. Outside the element region 302, there are formed a field ring and an equipotential ring (EQR; not shown) so as to raise the breakdown voltage.

Figure 4:
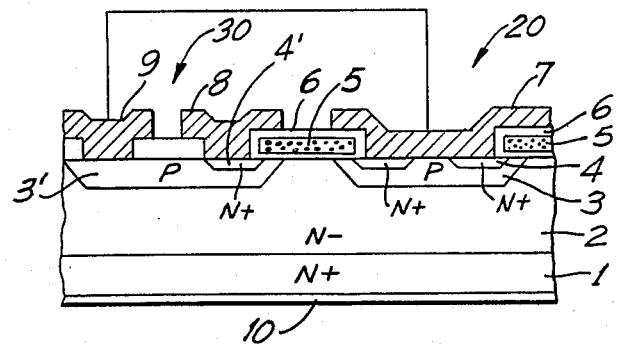
FIG. 4 is a cross section taken along line A-A' of FIG. 3.

FIG. 4 is a sectional view taken along line A-A' of FIG. 3 and exemplifying the n-channel. In FIG. 4, reference numeral 1 designates an N+-type drain, numeral 2, an N--type drain, numeral 3, a base, numeral 4, a source, numeral 5 a gate electrode, numeral 6, an insulating film, numeral 7, a source electrode, numeral 8, a current sensing electrode, numeral 9, a base electrode, and numeral 10, a drain electrode. A base region 3' of a current sensing cell 30 is electrically connected through the base electrode 9 with the source electrode 7 of an active cell 20. The current sensing electrode 8 is connected with only the source 4' of the current sensing cell 30. Since the base region 3' of the current sensing cell 30 is electrically connected with the base region 3 of the active cell 20, the extension of the depletion layer formed between the base region 3' and the N− drain region 2 is as large as that formed between the base region 3 and the N− drain region 2. Therefore, the breakdown voltage of the current sensing cell 30 is not lowered.

For manufacturing the MOS field effect transistor having a breakdown voltage of 60 V, for example, an N--type epitaxial layer 2 (i.e., N--type drain) doped with phosphorus in about $5 \times 10^{15}/cm^3$ and having a thickness of about 12 microns is grown over an N+-type silicon substrate 1 (i.e., N+-type drain) doped with antimony in about $2 \times 10^{18}/cm^2$. Then the gate oxide film 6 (having a thickness of about 1,000 Å) and the gate electrode 5 is formed. The gate electrode 5 is made of polycrystalline silicon doped with phosphorus in about $5 \times 10^{19}/cm^3$ and having a thickness of about 0.6 microns.

After having patterned the polycrystalline silicon of the gate electrode 5, boron ions are implanted at an accelerating voltage of about 70 KeV and in a dose of $1 \times 10^{14}/cm^2$. The implanted impurities are diffused at about 1,200° C. for about 60 minutes to form the P-type base layers 3 and 3'. Subsequently, phosphorus ions are implanted at an accelerating voltage of about 80 KeV and in a dose of $5 \times 10^{15}/cm^2$ and are annealed at about 1,000° C. for 30 minutes to form the N+-type source layers 4 and 4'. In this case, the P-type base layers 3 and 3' and the N+-type source layers 4 and 4' have depth of about 3.5 microns and about 1 microns, respectively. Incidentally, the source electrode 7, the current sensing electrode 8 and the base electrode 9 are made of aluminum.

Figure 5:
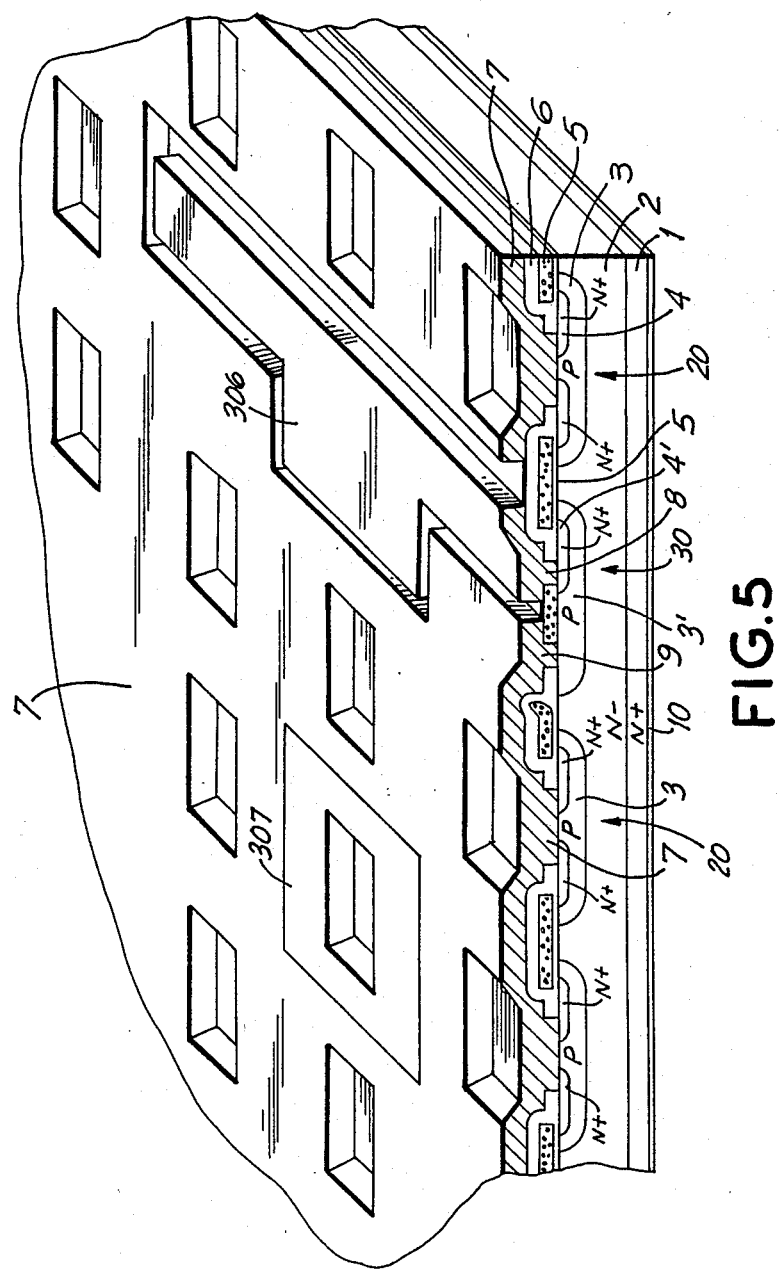
FIG. 5 is a perspective sectional view of a current sensing cell unit 300 of FIG. 3.

Referring to FIG. 5, the current sensing cell 30 takes a stripe structure. A mirror terminal 306 is connected with the current sensing electrode 8. A kelvin terminal 307 is formed on a portion of the source electrode 7. The base electrode 9 is formed commonly with the source electrode 7.

Figure 1:
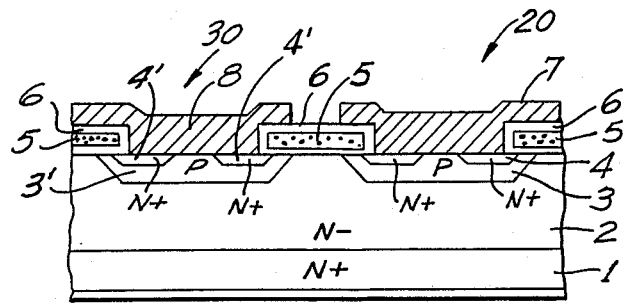
FIG. 1 is a sectional view for explaining a vertical power MOSFET having a current sensing terminal according to the prior art.
Figure 2:
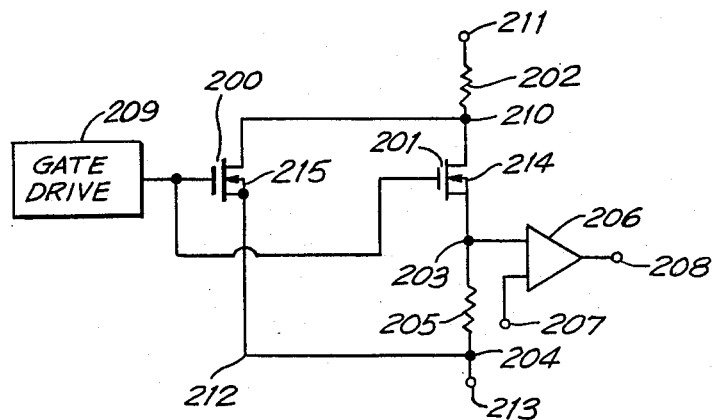
FIG. 2 is a circuit diagram showing the case in which a current is sensed using the MOSFET of the prior art shown in FIG. 1.
Figure 6:
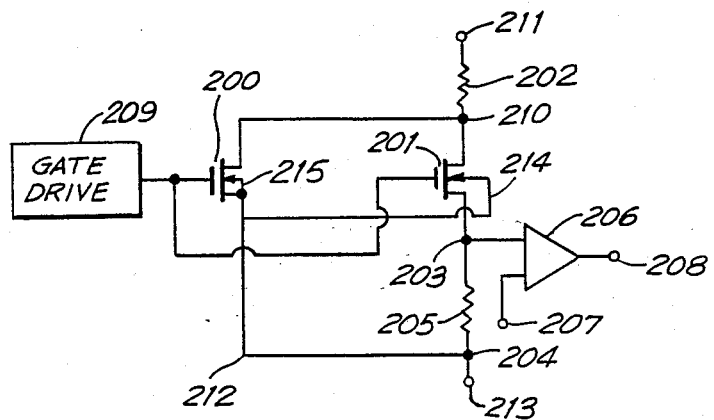
FIG. 6 is a circuit diagram showing the case in which the MOSFET of the first embodiment is used to sense the current.

FIG. 6 is a circuit diagram showing the case in which the MOSFET of the present embodiment is used for sensing the current. As compared with the example of the prior art in FIG. 2, a back gate 214 of a current sensing MOSFET 201 is electrically connected with a back gate 215 of a MOSFET 200 of the body. Therefore, the voltage forming the channel, i.e., the gate - back gate voltage difference of the body MOSFET 200 and that of the current sensing MOSFET 201 can be equalized to sense the current with high accuracy.

Figure 7:
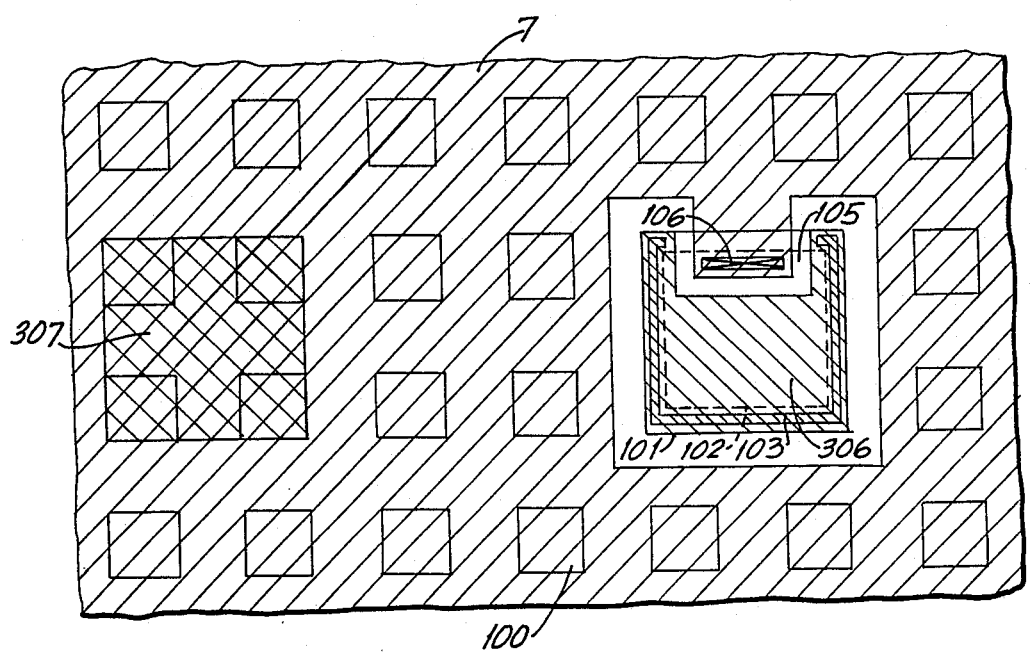
FIG. 7 is a plan view for explaining a second embodiment of the present invention.

FIG. 7 is a plan view for explaining a second embodiment of the present invention and is an enlargement of the current sensing cell unit of FIG. 3. In the present embodiment, the current sensing cell 30 is exemplified by having a size several times as large as the active cell 20 but may naturally be formed to have an equal size. In FIG. 7, reference numeral 100 designates the bases (in which the gate electrodes of polycrystalline silicon are removed) of the active cell 20, numeral 101, the base (in which the gate electrodes of polycrystalline silicon are removed) of the current sensing cell 30; numeral 102, an N+-type source; numeral 103, a contact window between the N+-type source 103 and the mirror electrode 306, numeral 105, the base (i.e., the region inside of the N+-type source), and numeral 106, the contact window for connecting the base 105 and the source aluminum 7.

Although the embodiment is exemplified by the N-channel type, the present invention can naturally be applied to the P-channel type.

What is claimed is:

1. A MOS field effect transistor comprising:
    a drain region of one conductivity type;
    a plurality of first base regions of the opposite conductivity type formed in one principal surface of said drain region;
    a plurality of first source regions of said one conductivity type formed in said first base regions;
    a first gate electrode formed over first portions of said first base regions, said first portions being sandwiched between said first source regions and said drain region;
    a source electrode connected commonly with said plurality of first base regions and said plurality of first source regions;

a second base region of said opposite conductivity type formed in said one principal surface of said drain region;

a second source region of said one conductivity type formed in said second base region;

a second gate electrode formed over a second portion of said second base region, said second portion being sandwiched between said second source region and said drain region, said second gate electrode being electrically connected with said first gate electrode;

a base electrode electrically connected with said second base region and said first source electrode, said base electrode being not connected with said second source region;

a current leading-out electrode electrically connected with said second source region, said current leading-out electrode being not connected with said second base region; and a drain electrode electrically connected with said drain region.

2. A MOS field effect transistor as claimed in claim 1, wherein said MOS field effect transistor is of vertical type, in which said drain electrode is formed on the other principal surface opposite to said one principal surface of said drain region.

3. A MOS field effect transistor as claimed in claim 2, wherein said second base region is surrounded by said plurality of first base regions.

4. A vertical MOSFET comprising:
a semiconductor substrate acting as a drain;
a first vertical MOSFET formed in said semiconductor substrate and having a plurality of first base regions and a plurality of first source regions in one principal surface of said semiconductor substrate;

a second vertical MOSFET for current sensing formed in said semiconductor substrate and having a second base region and a second source region in said one principal surface of said semiconductor substrate, said second base region being electrically connected with said first base regions, said second vertical MOSFET further having a current leading-out electrode electrically connected with said second source region, said current leading-out electrode being not connected with said second base region;

a gate electrode formed in said principal surface of said semiconductor substrate so that it may be used commonly for said first vertical MOSFET and said second vertical MOSFET;

a source electrode electrically connected commonly with said plurality of said first base regions and said plurality of said first source regions; and a drain electrode formed in the other principal surface opposite to said one principal plane of said semiconductor substrate.

5. A vertical MOSFET as claimed in claim 4, wherein said second vertical MOSFET is formed at the center of said first vertical MOSFET.

6. A vertical MOSFET as claimed in claim 5, further comprising:
a first connection pad electrically connected with said second base region ad formed at the center of said semiconductor substrate; and a second connection pad electrically connected with said current leading-out electrode and formed at the center of said semiconductor substrate.

* * * * *